(12) United States Patent
Lin

(10) Patent No.: US 11,443,959 B2
(45) Date of Patent: *Sep. 13, 2022

(54) SEMICONDUCTOR MANUFACTURING SYSTEM AND CONTROL METHOD

(71) Applicant: TAIWAN SEMICONDUCTOR MANUFACTURING CO., LTD., Hsinchu (TW)

(72) Inventor: Su-Horng Lin, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 54 days.

This patent is subject to a terminal disclaimer.

(21) Appl. No.: 17/027,494

(22) Filed: Sep. 21, 2020

(65) Prior Publication Data

US 2021/0005467 A1   Jan. 7, 2021

Related U.S. Application Data

(63) Continuation of application No. 15/691,470, filed on Aug. 30, 2017, now Pat. No. 10,867,812.

(51) Int. Cl.
*H01L 21/67* (2006.01)
*H05B 1/02* (2006.01)

(52) U.S. Cl.
CPC .... *H01L 21/67011* (2013.01); *H01L 21/6719* (2013.01); *H01L 21/67103* (2013.01); *H01L 21/67126* (2013.01); *H01L 21/67248* (2013.01); *H05B 1/0233* (2013.01)

(58) Field of Classification Search
CPC ......... H01L 21/67011; H01L 21/67103; H01L 21/67126; H01L 21/6719; H01L 21/67248; H01L 21/67023; H01L 21/67017; H05B 1/0233
See application file for complete search history.

(56) References Cited

U.S. PATENT DOCUMENTS

| | | | |
|---|---|---|---|
| 5,370,741 A | 12/1994 | Bergman | |
| 5,647,945 A | 7/1997 | Matsuse | |
| 6,015,465 A | 1/2000 | Kholodenko | |
| 6,135,052 A * | 10/2000 | Fujii | ................. H01L 21/67109 118/723 R |
| 6,189,484 B1 | 2/2001 | Yin | |
| 6,246,831 B1 | 6/2001 | Seitz | |
| 6,369,361 B2 | 4/2002 | Saito | |

(Continued)

*Primary Examiner* — David Colon-Morales
(74) *Attorney, Agent, or Firm* — Maschoff Brennan

(57) ABSTRACT

A system includes a chamber, an inlet valve, a control device, and a recycle pipe. The chamber is configured to perform a semiconductor process and including an output port. The inlet valve is coupled to the chamber and a supply pipe. The controller is coupled to the inlet valve and the chamber. The recycle pipe arranged outside the chamber and coupled to the chamber. The recycle pipe is independent from the supply pipe. The controller is configured to determine whether the chamber is idle, and is configured to control the inlet valve based on the determination of whether the chamber is idle. When the controller closes the output port of the chamber and opens the inlet valve, water from the supply pipe flows into a wall of the chamber through the inlet valve first and then flows into the recycle pipe.

20 Claims, 3 Drawing Sheets

(56) References Cited

U.S. PATENT DOCUMENTS

| | | |
|---|---|---|
| 6,461,524 B1 | 10/2002 | Tsuihiji |
| 6,629,423 B1 | 10/2003 | Hirooka |
| 6,833,109 B1 | 12/2004 | Aoki |
| 7,102,104 B2 | 9/2006 | Saito |
| 7,604,042 B2 | 10/2009 | Yamazaki |
| 7,661,386 B2 | 2/2010 | Kasai |
| 7,789,962 B2 | 9/2010 | Iwasaki |
| 8,137,467 B2 | 3/2012 | Meinhold |
| 8,157,951 B2 | 4/2012 | Buchberger, Jr. |
| 8,453,656 B2 | 6/2013 | Tousimis |
| 8,608,852 B2 | 12/2013 | Mahadeswaraswamy |
| 8,880,227 B2 | 11/2014 | Mahadeswaraswamy |
| 8,916,793 B2 | 12/2014 | Silveira |
| 9,034,142 B2 | 5/2015 | Bartlett |
| 9,165,804 B2 | 10/2015 | Mahadeswaraswamy |
| 9,256,231 B2 | 2/2016 | Yoshida |
| 9,338,871 B2 | 5/2016 | Mahadeswaraswamy |
| 9,831,111 B2 | 11/2017 | Busche |
| 10,108,162 B2 | 10/2018 | Mizutani |
| 10,415,862 B2 * | 9/2019 | Seki .................... F25B 1/00 |
| 10,867,812 B2 * | 12/2020 | Lin .................. H01L 21/67126 |
| 2005/0284574 A1 | 12/2005 | Tanaka |
| 2006/0135047 A1 | 6/2006 | Sheydayi |
| 2007/0243317 A1 | 10/2007 | Du Bois |
| 2011/0065276 A1 | 3/2011 | Ganguly |
| 2011/0220288 A1 | 9/2011 | Kobayashi |
| 2012/0048467 A1 | 3/2012 | Mahadeswaraswamy |
| 2012/0204576 A1 | 8/2012 | Matsuzaki |
| 2013/0105081 A1 | 5/2013 | Silveira |
| 2013/0105084 A1 | 5/2013 | Mahadeswaraswamy |
| 2014/0224767 A1 | 8/2014 | Merry |
| 2015/0060013 A1 | 3/2015 | Buchberger |
| 2017/0162417 A1 | 6/2017 | Ye |
| 2017/0203377 A1 * | 7/2017 | Yokoyama ........ H01L 21/67144 |

* cited by examiner

SEMICONDUCTOR MANUFACTURING SYSTEM AND CONTROL METHOD

PRIORITY CLAIM AND CROSS-REFERENCE

This application is a continuation of U.S. application Ser. No. 15/691,470, filed Aug. 30, 2017, which are herein incorporated by reference.

BACKGROUND

In semiconductor manufacturing technology, various semiconductor manufacturing processes are performed by various semiconductor manufacturing tools. The semiconductor manufacturing tools are disposed in a chamber. When particles or byproducts are deposited on walls of the chamber, the semiconductor manufacturing processes are affected.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or decreased for clarity of discussion.

DETAILED DESCRIPTION

Figure 1:
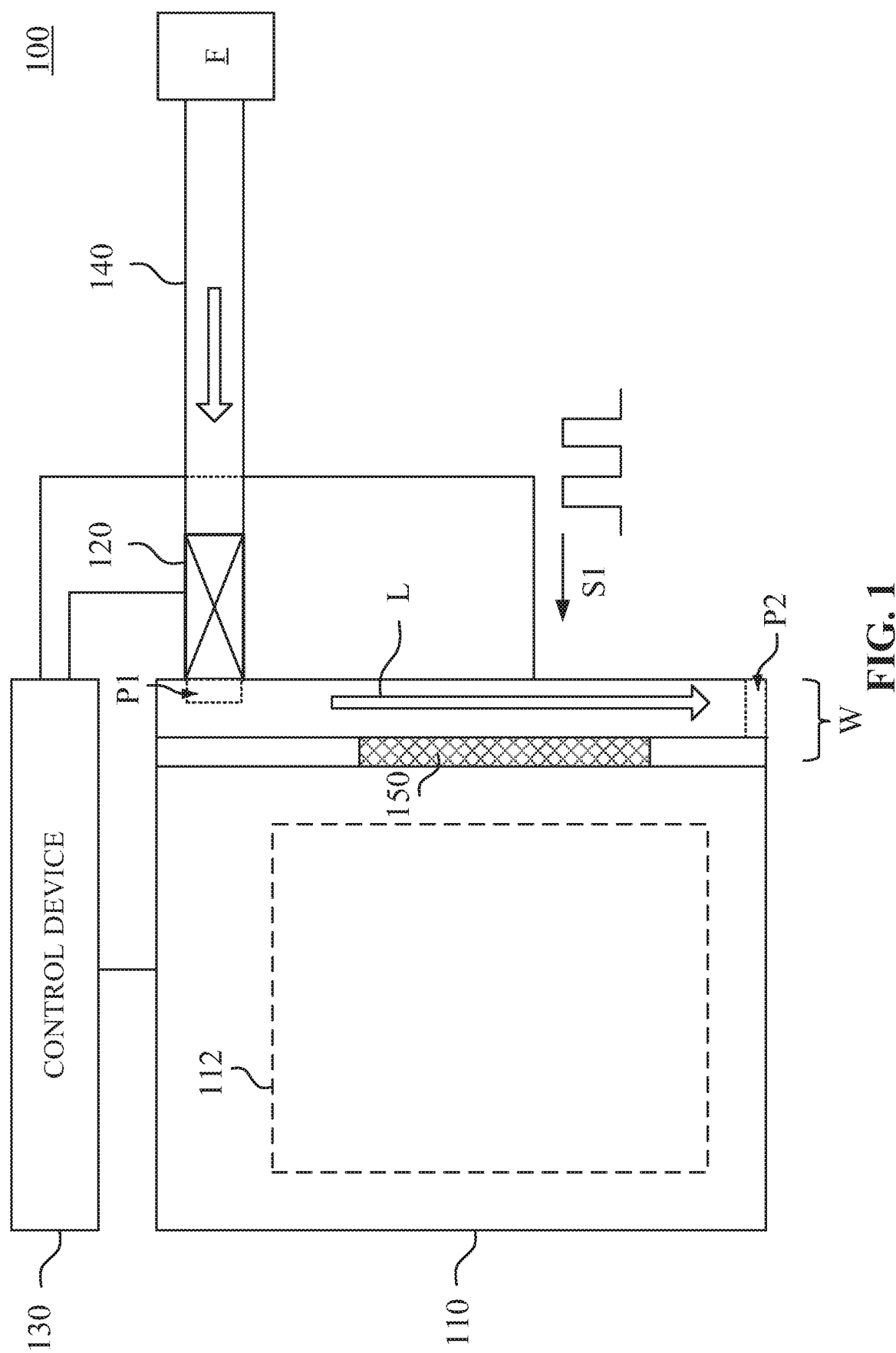
FIG. 1 is a schematic diagram of a system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the some embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to some embodiments given in this specification.

The terms "comprise," "comprising," "include," "including," "has," "having," etc. used in this specification are open-ended and mean "comprises but not limited."

Reference is now made to FIG. 1. FIG. 1 is a schematic diagram of a system 100, in accordance with some embodiments of the present disclosure.

In some embodiments, the system 100 is implemented to be as a semiconductor manufacturing system. In some embodiments, the system 100 is configured to perform a semiconductor process. In some embodiments, the system 100 includes a chamber 110, an inlet valve 120, and a control device 130. In some embodiments, the control device 130 is coupled to the chamber 110 and the inlet valve 120.

In this document, the term "coupled" may also be termed as "electrically coupled," and the term "connected" may be termed as "electrically connected" or "physically connected". "Coupled" and "connected" may also be used to indicate that two or more elements cooperate or interact with each other.

In some embodiments, the chamber 110 includes a tool 112. In some embodiments, the tool 112 is implemented with a semiconductor manufacturing tool. In some embodiments, the chamber 110 is arranged as a room at which the semiconductor process is performed. In some embodiments, the tool 112 is arranged in the room and configured to perform the semiconductor process. The semiconductor process is, for example, an etching process, a deposition process such as a chemical vapor deposition (CVD) process, or a diffusion (DIF) process. The aforementioned semiconductor processes are given for illustrative purposes only. Various semiconductor processes are within the contemplated scope of the present disclosure.

In some embodiments, the implementations of the tool 112 are with respect to the semiconductor process. For example, if the tool 112 is configured to perform the etching process, the tool 112 includes a top electrode plate (not shown), a bottom electrode plate (not shown), and a radio frequency (RF) generator (not shown). The radio frequency generator generates a voltage difference between the top electrode plate and the bottom electrode plate, in order to generate plasma and to etch a wafer on the bottom electrode. The aforementioned implementations of the tool 112 are given for illustrative purposes only. Various implementations of the tool 112 are within the contemplated scope of the present disclosure.

In some embodiments, the chamber 110 includes an input port P1. In some embodiments, the inlet valve 120 is coupled between the input port P1 and a supply pipe 140. In some embodiments, the supply pipe 140 is connected to a factory or facility water source F as illustrated in FIG. 1. The factory or the facility water source F supplies some water, and the water is supplied, through the supply pipe 140, into the chamber 110. In some embodiments, the water supplied from the factory or the facility water source F is also referred to as process cooling water (PCW). In some embodiments, the input port P1 is formed on a wall W of the chamber 110, as shown in FIG. 1. In some embodiments, the wall W is a side wall of the chamber 110. In some embodiments, the wall W includes an inner space as shown in FIG. 1. Water from the supply pipe 140 flows, through the inlet valve 120, into the inner space of the wall W when the inlet valve 120 is not fully closed. In various embodiments, the input port P1 is formed on more than one wall W of the chamber 110. The wall W illustrated above in the embodiments is given for illustrative purposes. In various embodiments, the wall W shown in FIG. 1 is also referred to as including separate walls and an inner space formed in-between.

In some embodiments, the inlet valve 120 is implemented with a throttle. The aforementioned implementations of the inlet valve 120 are given for illustrative purposes only.

Various implementations of the inlet valve 120 are within the contemplated scope of the present disclosure.

In some embodiments, the control device 130 is configured to detect a state of the chamber 110. For example, the control device 130 is configured to detect whether the chamber 110 is idle or not. In some embodiments, the chamber 110 is idle when the tool 112 is turned off or the tool 112 stops or finishes performing the semiconductor process. The chamber 110 is not idle when the tool 112 performs the semiconductor process. In some embodiments, the control device 130 is configured to control the inlet valve 120 according to the state of the chamber 110. For example, the control device 130 controls the inlet valve 120 to be opened to a predetermined percentage when the chamber 110 is idle, and the control device 130 controls the inlet valve 120 to be fully open when the chamber 110 is not idle. For various illustrations, the above operations are also referred to as that the control device 130 controls the inlet valve 120 to be partially closed to a predetermined percentage when the chamber 110 is idle, and to be fully open when the chamber 110 is not idle. In some embodiments, the predetermined percentage is in a range 25%-75%. Effectively, the control device 130 at least partially closes the inlet valve 120 when the chamber 110 is idle. In some embodiments, the control device 130 is implemented by a computer, a central processing unit (CPU), or a micro control unit (MCU). In some embodiments, software is installed in the control device 130, and the control device 130 executes the software to control the inlet valve 120. The aforementioned implementations of the control device 130 are given for illustrative purposes only. Various implementations of the control device 130 are within the contemplated scope of the present disclosure.

In some embodiments, the chamber 110 includes an output port P2. In some embodiments, a path L exists for the flow between the input port P1 and the output port P2 in the inner space of the wall W. In some embodiments, the water from the supply pipe 140 flows through the inlet valve 120 and the path L, and flows out of the wall W though the output port P2. In some embodiments, the water flowing out of the wall W through the output port P2 flows to a scrubber equipment (not shown).

In some embodiments, particles or byproducts are generated in the chamber 110 when the tool 112 performs the semiconductor process. If the particles or byproducts are deposited on the walls of the chamber 110, the semiconductor process will be affected. For example, performance of the semiconductor process will deteriorate when the particles or byproducts are deposited on the walls of the chamber 110. In some cases, particles intended to be deposited on the wafer may end up on the walls, and then the amount on the wafer may be less than as designed, affecting wafer uniformity. In some cases, particles deposited earlier may be released from the walls onto a wafer in process, causing particles and contamination issues.

In some embodiments, a heating element 150 is disposed at the inner space of the wall W, as shown in FIG. 1. In some embodiments, a location of the heating element 150 corresponds to the path L as shown in FIG. 1. For example, the heating element 150 is arranged along the path L. In some embodiments, the inner space of the wall W is divided into two regions. For illustration in FIG. 1, the path L is arranged at one region of the regions, and the heating element 150 is arranged at the other region of the regions. For illustration in FIG. 1, the heating element 150 is configured to heat the wall W, and the water flowing through the path L is heated accordingly. In some embodiments, the heating element 150 heats the wall W from a first temperature to a second temperature higher than the first temperature. In some embodiments, the water is heated from the first temperature to the second temperature accordingly. The first temperature is in a range of, for example, 15-20° C. In some embodiments, the second temperature is a predetermined temperature. In some embodiments, the predetermined temperature is higher than a room temperature. The second temperature is in a range of, for example, approximately 50-70° C. The aforementioned temperature values of the first temperature and the second temperature are given for illustrative purposes only. Various temperature values of the first temperature and the second temperature are within the contemplated scope of the present disclosure. With the heating element 150 heating the wall W to the second temperature, a temperature of the wall W becomes the second temperature. For illustration, the particles or byproducts are unable to be attached to the wall W which has the second temperature. Thus, the particles or byproducts are prevented from being deposited on the wall W.

In some embodiments, the control device 130 is configured to generate a driving signal S1, in order to control the heating element 150. In some embodiments, the driving signal S1 is a pulse width modulation (PWM) signal. In some embodiments, the control device 130 includes or controls a PWM generator to generate the PWM signal. In some embodiments, output power of the heating element 150 is associated with a duty cycle of the driving signal S1. In some embodiments, the output power of the heating element 150 has a positive correlation to the duty cycle of the driving signal S1. For example, the output power of the heating element 150 is larger if the duty cycle of the driving signal S1 is larger, and the output power of the heating element 150 is smaller if the duty cycle of the driving signal S1 is smaller. In some embodiments, the control device 130 is able to adjust the duty cycle of the driving signal S1 to control the output power of the heating element 150. In some embodiments, the heating element 150 is implemented with one or more resistive heaters (not shown). The implementations of the heating element 150 are given for illustrative purposes only. Various implementations of the heating element 150 are within the contemplated scope of the present disclosure. For example, the heating element 150 is implemented with a UV light, a laser LED, or other heating device.

The implementations of the system 100 are given for illustrative purposes only. Various implementations of the system 100 are within the contemplated scope of the present disclosure. For example, although FIG. 1 shows the path L on one side of the chamber 110, the path L may circumvent the chamber 110 through various paths on all of the sidewalls of the chamber 110 in various embodiments. Accordingly, by adjusting the inlet valve 120, the water is controlled to flow along the path L in-between the chamber walls. For another example, in various embodiments, there are more than one heating element 150 and/or more than one path L, as illustrated in FIG. 1, arranged on other walls W of the chamber 110.

Figure 2:
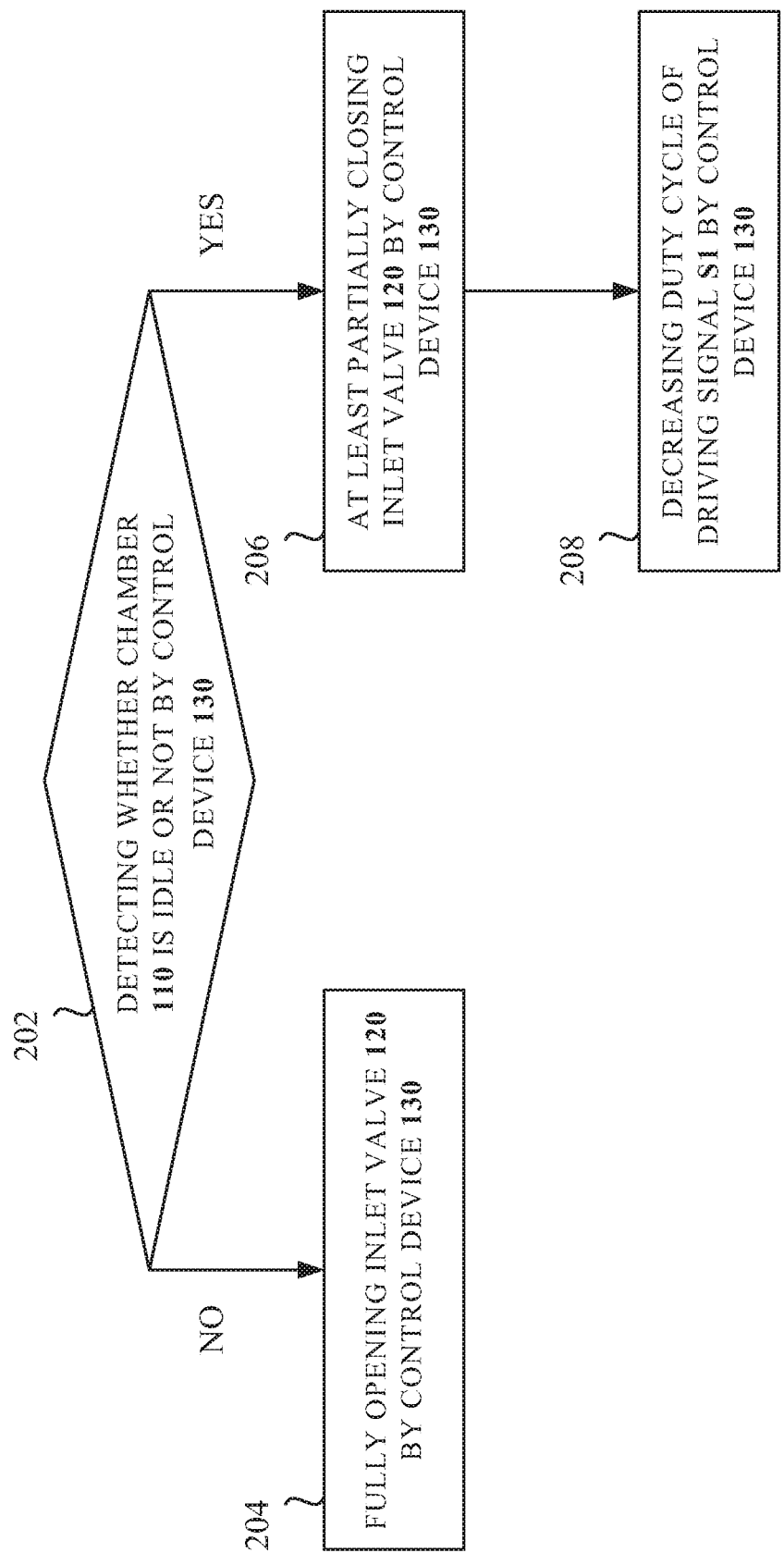
FIG. 2 is a flow chart of a method illustrating operations of the system in FIG. 1, in accordance with some embodiments of the present disclosure.

Reference is now made to FIG. 2. FIG. 2 is a flow chart of a method 200 illustrating operations of the system 100 in FIG. 1, in accordance with some embodiments of the present disclosure. For ease of understanding of the present disclosure, the method 200 is discussed in relation to FIG. 1, but the present disclosure is not so limited.

In operation 202, the control device 130 detects whether the chamber 110 is idle or not. In some embodiments, the chamber 110 is idle when the tool 112 is turned off or the tool 112 stops or finishes performing the semiconductor process.

In some embodiments, the chamber 110 is not idle when the tool 112 performs the semiconductor process.

In operation 204, the control device 130 fully opens the inlet valve 120 when the chamber 110 is not idle. Effectively, the control device 130 fully opens the inlet valve 120 while the tool 112 performs the semiconductor process. In some embodiments, the control device 130 controls the inlet valve 120 in response to a control signal (not shown), and an openness of the inlet valve 120 depends on the control signal. Explained in a different way, in some embodiments, the control device 130 outputs the control signal to control the openness of the inlet valve 120. In some embodiments, the openness of the inlet valve 120 indicates an opening size of the inlet valve 120, or indicates a degree of the inlet valve 120 being open. In some embodiments, the openness of the inlet valve 120 is defined by a percentage. For example, the openness of the inlet valve 120 is 100% when the inlet valve 120 is fully open. The openness of the inlet valve 120 is 0% when the inlet valve 120 is fully closed.

In some embodiments, volume flow rate of the water flowing into the wall W is the largest when the inlet valve 120 is fully open. In some embodiments, the control device 130 controls the heating element 150 to heat the wall W, such that the water flowing through the path L from a lower temperature to a higher temperature. For example, the water in the supply pipe 140 is 17° C. The water flows through the inlet valve 120, the input port P1, and the path L. The water flowing through the path L is heated from 17° C. to 60° C. Then, the water then flows out of the wall W through the output port P2. The water flowing through the path L and the wall W is then maintained to have a temperature (for example, 60° C.), in order to prevent the particles or byproducts from being deposited on the wall W.

The configuration of the control device 130 and the inlet valve 120, as discussed above, is given for illustrative purposes. Various configurations are within the contemplated scope of the present disclosure. For example, in various embodiments, there are more than one control device configured to control the inlet valve 120, for illustration, with coarse and/or fine adjustment, in order to control the volume flow rate of the water flowing into the wall W. In various embodiments, there are more than one inlet valve controlled by the control device, in order to control the volume flow rate of the water flowing into the wall W.

In operation 206, the control device 130 at least partially closes the inlet valve 120 when the chamber 110 is idle. For example, the control device 130 closes the inlet valve 120 to a predetermined percentage. In some embodiments, the chamber 110 is idle when the tool 112 is turned off or stops or finishes performing the semiconductor process. Effectively, the inlet valve 120 is set to the predetermined percentage when the tool 112 is turned off or stops or finishes performing the semiconductor process. Usually, the condition for changing the inlet valve 120 depends on how and whether condition inside the chamber 110 is changing and whether the condition would affect wafers in the chamber 110 or future wafers. In some embodiments, the predetermined percentage is in a range from 25%-75%. The openness of the inlet valve 120 depends on the predetermined percentage. Depending on the type of the inlet valve 120 and the control device 130, the openness of the inlet valve 120 has a negative correlation to the predetermined value. For example, the openness of the inlet valve 120 becomes 75% of the full openness when the control device 130 closes the inlet valve 120 to 25% of the full openness. The openness of the inlet valve 120 becomes 25% of the full openness when the control device 130 closes the inlet valve 120 to 75% of the full openness. Alternatively stated, the openness of the inlet valve 120 increases when the degree of the control device 130 closing the inlet valve 120 decreases, and vice versa. The aforementioned values of the predetermined percentage are given for illustrative purposes only. Various values of the predetermined percentage are within the contemplated scope of the present disclosure. In some embodiments, the control device 130 fully closes the inlet valve 120 when the chamber 110 is idle.

In some embodiments, the control device 130 reduces the volume flow rate of the water by closing the inlet valve 120 to the predetermined percentage. In some embodiments, the volume flow rate of the water flowing into the wall W has a positive correlation to the openness of the inlet valve 120. As described above, the openness of the inlet valve 120 has the negative correlation to the predetermined value. The volume flow rate of the water flowing into the wall W corresponds to the openness of the inlet valve 120. Accordingly, the volume flow rate of the water flowing into the wall W has the negative correlation to the predetermined value. For example, the volume flow rate increases when the degree of the inlet valve 120 being closed decreases, and the volume flow rate decreases when the degree of the inlet valve 120 being closed increases.

As described above, in some embodiments, the water flows out of the wall W through the output port P2 to the scrubber equipment (not shown). By closing the inlet valve 120 to a predetermined percentage when the chamber 110 is idle, the volume flow rate of the water flowing into the wall W is reduced when the chamber 110 is idle. Thus, the water can be saved when the chamber 110 is idle.

In operation 208, the control device 130 decreases the duty cycle of the driving signal S1 when the inlet valve 120 is closed to the predetermined percentage. As described above, in some embodiments, the volume flow rate of the water flowing into the wall W is reduced when the inlet valve 120 is closed to the predetermined percentage. When the volume flow rate of the water flowing into the wall W is reduced, less output power of the heating element 150 is needed. In some embodiments, the output power of the heating element 150 has a positive correlation to the duty cycle of the driving signal S1. In some embodiments, the control device 130 decreases the duty cycle of the driving signal S1, in order to decrease the output power of the heating element 150. Thus, power consumption of the system 100 can be reduced when the chamber 110 is idle.

In some embodiments, the duty cycle of the driving signal S1 is controlled to have a positive correlation to the predetermined percentage. For example, the inlet valve 120 is closed to 50% of the full openness when the chamber 110 is idle. The control device 130 decreases the duty cycle of the driving signal S1 with 50%. For illustration, if the duty cycle of the driving signal S1 is set to be 25% in a normal condition, the control device 130 decreases the duty cycle of the driving signal S1 to be 12.5% when the chamber 110 is idle. Thus, the output power of the heating element 150 is reduced. Effectively, a decrease of the duty cycle of the driving signal S1 or a decrease of the output power of the heating element 150 depends on the predetermined percentage.

In some embodiments, a thermal detecting device (not shown) is arranged in the chamber 110 and coupled to the control device 130. In some embodiments, the thermal detecting device is configured to detect the temperature of the wall W. In some embodiments, the control device 130 adjusts the duty cycle of the driving signal S1 when the detected temperature is higher than the aforementioned predetermined temperature. For example, the control device 130 decreases the duty cycle of the driving signal S1 when the detected temperature is higher than 60° C. When the duty cycle of the driving signal S1 is decreased, the output power of the heating element 150 is decreased. When the output power of the heating element 150 is decreased, the temperature of the water flowing through the path L is decreased. When the temperature of the water flowing through the path L is decreased, the temperature of the wall W is decreased. For example, the water flowing through the path L is decreased to 60° C., and the temperature of the wall W is correspondingly decreased to 60° C. With mechanisms of terminal detection and adjustment of the duty cycle of the driving signal S1, the temperature of the wall W can be maintained at the predetermined temperature, in order to avoid overheating and to reduce power consumption of the system 100.

The above description of the method 200 includes exemplary operations, but the operations of the method 200 are not necessarily performed in the order described. The order of the operations of the method 200 disclosed in the present disclosure are able to be changed, or the operations are able to be executed simultaneously or partially simultaneously as appropriate, in accordance with the spirit and scope of some embodiments of the present disclosure. In addition, the operations may be added, replaced, changed order, and/or eliminated as appropriate, in accordance with the spirit and scope of some embodiments of the present disclosure.

Figure 3:
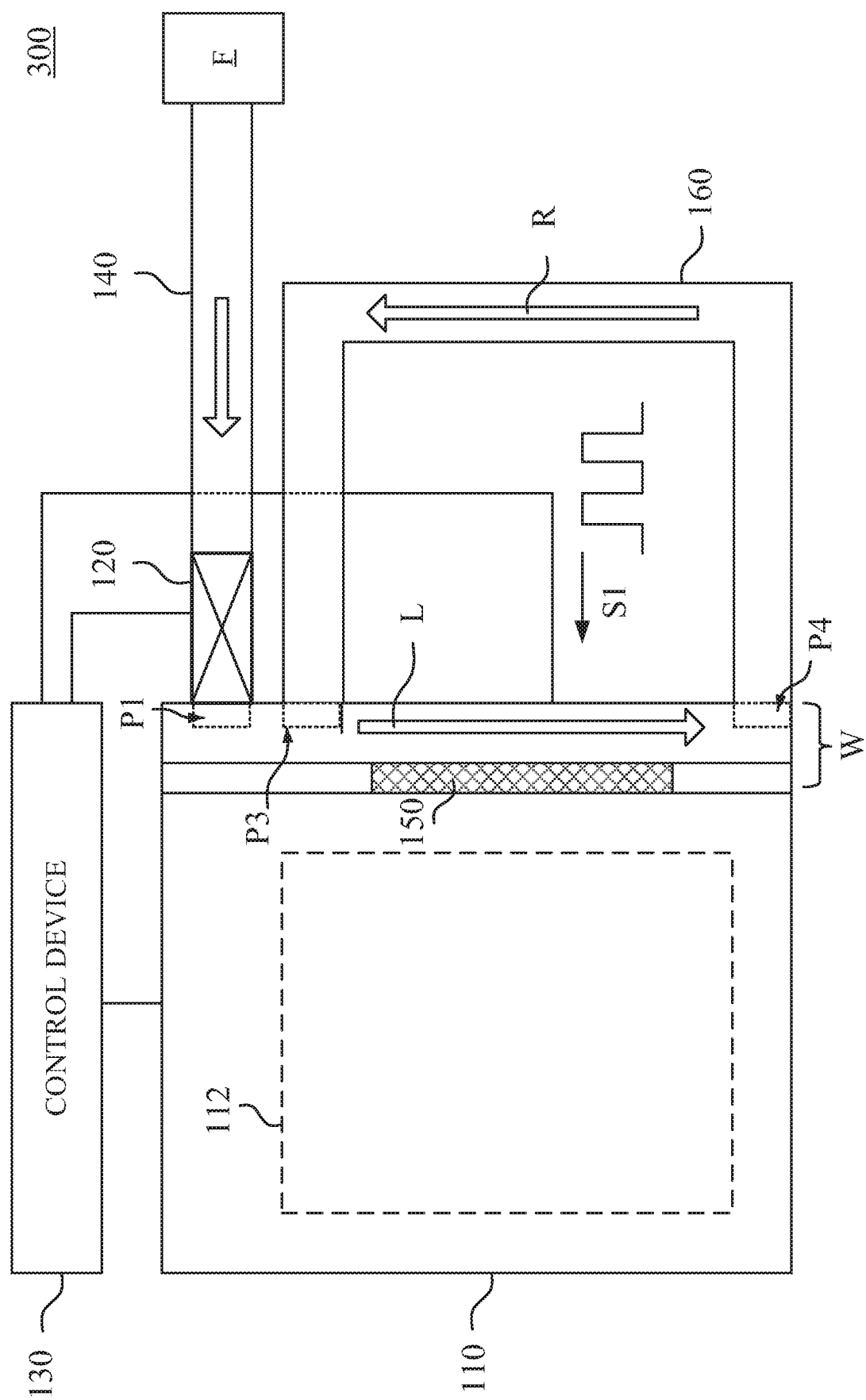
FIG. 3 is a schematic diagram illustrating a system, in accordance with some embodiments of the present disclosure.

Reference is now made to FIG. 3. FIG. 3 is a schematic diagram of a system 300, in accordance with some embodiments of the present disclosure. For ease of understanding, with respect to the embodiments of FIG. 1, like elements in FIG. 3 are designated with the same reference numbers. In some embodiments, the method 200 is implemented to the system 300.

In some embodiments, the chamber 110 includes a recycle inlet P3 and an outlet P4. For illustration in FIG. 3, the recycle inlet P3 and the outlet P4 are formed on the wall W of the chamber 110. The aforementioned implementations of the recycle inlet P3 and the outlet P4 are given for illustrative purposes only. Various implementations of the recycle inlet P3 and the outlet P4 are within the contemplated scope of the present disclosure. For example, the recycle inlet P3 and the outlet P4 are formed on two different wall sections of the chamber 110.

In some embodiments, a recycle pipe 160 is connected to the chamber 110. In some embodiments, the recycle pipe 160 is arranged outside of the chamber 110. In some embodiments, the recycle pipe 160 is configured for the water to flow back to the chamber 110. In some embodiments, the recycle pipe 160 is arranged between the recycle inlet P3 and the outlet P4. For example, one end of the recycle pipe 160 is connected to the recycle inlet P3, and another end of the recycle pipe 160 is connected to the outlet P4. In some embodiments, a recycle path R is formed in the recycle pipe 160. Effectively, the recycle path R is outside of the chamber 110, and the recycle path R is formed between the recycle inlet P3 and the outlet P4. For illustration, the water in the wall W flows out of the chamber 110 through the outlet P4. Then, the water flows into the recycle pipe 160, and reflows into the wall W through the recycle inlet P3. Effectively, a recirculation path is formed by the wall W, the outlet P4, the recycle pipe 160, and the recycle inlet P3. With the recycle pipe 160, the water can be recycled to flow into the chamber 110, instead of flowing to the scrubber equipment through the output port P2 as illustrated in FIG. 1. Thus, the water can be saved.

In some embodiments, the recycle pipe 160 is independent from the supply pipe 140. For example, the recycle pipe 160 and the supply pipe 140 are connected to different input ports P3 and P1 respectively. The aforementioned implementations of the recycle pipe 160 are given for illustrative purposes only. Various implementations of the recycle pipe 160 are within the contemplated scope of the present disclosure.

In some embodiments, the water in recirculation path can be refreshed. In some embodiments, the water in recirculation path flows out of the wall W from an output port (for example, the output port P2 illustrated in FIG. 1), and the control device 130 then closes the output port. The control device 130 then controls the inlet valve 120 to be open. Water from the supply pipe 140 flows into the wall W through the inlet valve 120. Thus, the water in recirculation path can be refreshed.

In some embodiments, the temperature of the water flowing into the recycle pipe 160 decreases because the water is unable to be heated in the recycle pipe 160. In some embodiments, the temperature of the water in the recycle pipe 160 is a third temperature, and the third temperature is below the aforementioned predetermined temperature. In some embodiments, when the water in the recycle pipe 160 flows, through the recycle inlet P3, into the wall W again, the water is heated from the third temperature to the predetermined temperature. In some embodiments, the third temperature is higher than the first temperature of the water from the supply pipe 140. The power for heating water from the third temperature to the predetermined temperature is less than the power for heating the water from the first temperature to the predetermined temperature. Thus, with the recycle pipe 160, the power consumption of the system 300 can be reduced.

As described above, in some embodiments, the thermal detecting device is configured to detect the temperature of the wall W. In some embodiments, the control device 130 adjusts the openness of the inlet valve 120 when the detected temperature is higher than the aforementioned predetermined temperature. For example, when the detected temperature is higher than 60° C., the control device 130 outputs a control signal (not shown), in order to open the inlet valve 120 to a higher percentage. Correspondingly, the water in the recirculation path increases. Thus, more water is heated. The temperature of the more water decreases when the output power of the heating element 150 is fixed. Thus, the system 300 is prevented from overheating.

The implementations of the system 300 are given for illustrative purposes only. Various implementations of the system 300 are within the contemplated scope of the present disclosure. For example, the numbers and/or positions of the recycle inlet P3, the outlet P4, and/or the recycle pipe 160 are given for illustrative purposes. In various embodiments, various numbers and/or positions of the recycle inlet P3, the outlet P4, and/or the recycle pipe 160 are within the contemplated scope of the present disclosure.

In some embodiments, a system is disclosed that includes a chamber, an inlet valve, a control device, and a recycle pipe. The chamber is configured to perform a semiconductor process and including an output port. The inlet valve is coupled to the chamber and a supply pipe. The controller is coupled to the inlet valve and the chamber. The recycle pipe arranged outside the chamber and coupled to the chamber. The recycle pipe is independent from the supply pipe. The controller is configured to determine whether the chamber is idle, and is configured to control the inlet valve based on the determination of whether the chamber is idle. When the controller closes the output port of the chamber and opens the inlet valve, water from the supply pipe flows into a wall of the chamber through the inlet valve first and then flows into the recycle pipe.

Also disclosed is a system that includes a chamber, a control device, and a recycle pipe. The chamber is configured to perform a semiconductor process. The controller is configured to control an inlet valve coupled to an input port of the chamber to reduce a first volume flow rate of water flowing into the chamber from a supply pipe when the chamber is idle. The water flows along a side wall of the chamber. The recycle pipe is separate from the supply pipe. The recycle pipe, a recycle inlet of the chamber, the side wall of the chamber, and an outlet of the chamber are coupled together as a recycle path of water.

Also disclosed is a method that includes the operations below. Whether a chamber is idle or not is detected. An inlet valve is controlled to be partially closed to a predetermined percentage when the chamber is idle. The inlet valve is coupled to the chamber and configured to allow water to flow in-between chamber walls based on whether the chamber is idle. An output port of the chamber is controlled to be closed and the inlet valve is controlled to be open, such that water from a supply pipe flows into one of the chamber walls through the inlet valve first and then flows into the recycle pipe.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
a chamber configured to perform a semiconductor process and comprising an output port;
an inlet valve coupled to the chamber and a supply pipe;
a controller coupled to the inlet valve and the chamber; and
a recycle pipe arranged outside the chamber and coupled to the chamber, wherein the recycle pipe is independent from the supply pipe,
wherein the controller is configured to determine whether the chamber is idle, and is configured to control the inlet valve based on the determination of whether the chamber is idle,
wherein when the controller closes the output port of the chamber and opens the inlet valve, water from the supply pipe flows into a wall of the chamber through the inlet valve first and then flows into the recycle pipe.

2. The system of claim 1, wherein the recycle pipe is coupled between a recycle inlet of the chamber and an outlet of the chamber.

3. The system of claim 2, wherein the recycle inlet and the outlet are formed on the wall of the chamber.

4. The system of claim 1, further comprising:
a heater arranged at the wall of the chamber, wherein the controller is coupled to the heater and configured to output a driving signal with a duty cycle to control the heater when the inlet valve is at least partially closed.

5. The system of claim 4, wherein the controller is configured to output the driving signal with the duty cycle having a correlation to a degree of the inlet valve being closed.

6. The system of claim 4, wherein a decrease of output power of the driving signal has a positive correlation to a degree of the inlet valve being closed.

7. The system of claim 1, wherein the controller is configured to at least partially close the inlet value to a predetermined percentage, and the predetermined percentage has a correlation to at least one of an openness of the inlet valve, a second volume flow rate of water flowing into the wall of the chamber, or a duty cycle of a driving signal outputted by the controller for controlling a heater.

8. The system of claim 1, wherein the chamber comprises an input port and the inlet valve is coupled to the input port.

9. The system of claim 1, wherein the controller is further configured to control the inlet valve to be fully open when the chamber is not idle.

10. A system, comprising:
a chamber configured to perform a semiconductor process;
a controller configured to control an inlet valve coupled to an input port of the chamber to reduce a first volume flow rate of water flowing into the chamber from a supply pipe when the chamber is idle, wherein the water flows along a side wall of the chamber; and
a recycle pipe separate from the supply pipe, wherein the recycle pipe, a recycle inlet of the chamber, the side wall of the chamber, and an outlet of the chamber are coupled together as a recycle path of water.

11. The system of claim 10, wherein the recycle pipe and the supply pipe are connected to different input ports of the chamber respectively.

12. The system of claim 10, further comprising:
a heater arranged at the side wall of the chamber, wherein the controller is configured to output a driving signal with a duty cycle to control the heater when the first volume flow rate is reduced.

13. The system of claim 12, wherein the duty cycle has a correlation to the first volume flow rate.

14. The system of claim 12, wherein the controller is configured to decrease output power of the driving signal when the first volume flow rate is reduced.

15. The system of claim 12, wherein the side wall of the chamber includes an inner space including separate regions, wherein the heater is arranged at a first region of the separate regions, and the input port of the chamber, which is coupled to the inlet valve, is arranged at a second region of the separate regions.

16. A method, comprising:
detecting whether a chamber is idle or not; and
controlling an inlet valve, which is coupled to the chamber and configured to allow water to flow in-between chamber walls, based on whether the chamber is idle, wherein controlling the inlet valve comprises:
partially closing the inlet valve to a predetermined percentage when the chamber is idle; and
closing an output port of the chamber and opening the inlet valve, such that water from a supply pipe flows into one of the chamber walls of the chamber through the inlet valve first and then flows into a recycle pipe.

17. The method of claim 16, further comprising:
adjusting a duty cycle of a driving signal for a heater when the inlet valve is closed to the predetermined percentage.

18. The method of claim 17, wherein a decrease of the duty cycle has a positive correlation to the predetermined percentage.

19. The method of claim 16, further comprising:
decreasing output power of a driving signal for a heater when the inlet valve is closed to the predetermined percentage.

20. The method of claim 19, wherein a decrease of the output power has a positive correlation to the predetermined percentage.

* * * * *